United States Patent
Smith et al.

(10) Patent No.: US 7,617,428 B2
(45) Date of Patent: Nov. 10, 2009

(54) CIRCUITS AND ASSOCIATED METHODS FOR IMPROVED DEBUG AND TEST OF AN APPLICATION INTEGRATED CIRCUIT

(75) Inventors: Paul J. Smith, Colorado Springs, CO (US); Brad D. Besmer, Colorado Springs, CO (US); Guy W. Kendall, Colorado Springs, CO (US)

(73) Assignee: LSI Corporation, Milpitas, CA (US)

( * ) Notice: Subject to any disclaimer, the term of this patent is extended or adjusted under 35 U.S.C. 154(b) by 351 days.

(21) Appl. No.: 11/508,585

(22) Filed: Aug. 23, 2006

(65) Prior Publication Data

US 2008/0052574 A1   Feb. 28, 2008

(51) Int. Cl.
*G01R 31/28* (2006.01)
*G06F 7/02* (2006.01)
*G06F 13/24* (2006.01)

(52) U.S. Cl. .................... 714/724; 714/819; 710/260
(58) Field of Classification Search ............ None
See application file for complete search history.

(56) References Cited

U.S. PATENT DOCUMENTS

| | | | | |
|---|---|---|---|---|
| 5,421,027 A | * | 5/1995 | Benzel et al. | 713/323 |
| 5,987,556 A | * | 11/1999 | Nakagawa et al. | 710/305 |
| 7,340,575 B2 | * | 3/2008 | Barret et al. | 711/164 |
| 2006/0206646 A1 | * | 9/2006 | Shrivastava et al. | 710/260 |

* cited by examiner

*Primary Examiner*—Christine T Tu
(74) *Attorney, Agent, or Firm*—Duft Bornsen & Fishman LLP

(57) ABSTRACT

Circuits and associated methods for testing internal operation of an application integrated circuit. Features and aspects hereof add configurable test interrupt circuits to an application circuit design to permit dynamic, configurable interrupt generation from an integrated circuit based on conditions determined from monitoring of internal signals of the application circuit. The internal signals that may be tested and used to generate test interrupts are those not exposed to the external processor interface of the integrated circuit and thus may be configured to interrupt based on any internal state of the application specific functional circuits of the integrated circuit.

12 Claims, 4 Drawing Sheets

CIRCUITS AND ASSOCIATED METHODS FOR IMPROVED DEBUG AND TEST OF AN APPLICATION INTEGRATED CIRCUIT

BACKGROUND OF THE INVENTION

1. Field of the Invention

The invention relates generally to integrated circuit design, fabrication, and test and more specifically relates to circuits added to an integrated circuit application design to allow dynamic and flexible generation of an interrupt signal from the integrated circuit based on internal states of the integrated circuit not exposed to the external processor coupled to the application circuit.

2. Discussion of Related Art

Application specific integrated circuits perform a number of useful functions in electronic circuit designs. Many application integrated circuits, for example, provide I/O or other interface features for use by an attached general or special purpose processor. Other exemplary application specific integrated circuits provide computational or data manipulation assist logic for particular application needs. In general, all such integrated circuits that are adapted for coupling to an associated general or special purpose processor do so by providing a documented programming interface between the application specific integrated circuit and the attached processor. This programming interface typically defines a set of locations or ports that may be read and/or written by the external processor to interact with the features of the application specific integrated circuit. Often these locations/ports represent a set of registers in which defined fields or bits are used for configuring operation of the application circuit and/or for sensing particular status as regards operation of the application specific integrated circuit.

Although significant functionality of the application circuit may be presented to the processor through the specified, supported, programming interface, in circuit test or debug environments substantial additional information regarding operation of the application specific integrated circuit may be useful. However, such additional internal signals are generally unavailable to the standard processor interface. Rather, the application specific integrated circuit includes a variety of internal signals that remain strictly internal to the operation of the application specific integrated circuit never exposed through the supported, specified programming interface.

Problems may arise in the debug of an application specific integrated circuit and/or the testing of an application specific integrated circuit. Particular error condition may not be detectable or capable of diagnosis solely from the information provided in the standard, specified programming interface and an external processor. Rather, substantial status information available only through internal signals of the application specific integrated circuit may be required for debug and/or diagnosis of certain failures in the integrated circuit.

In the context of design debug of an integrated circuit, such internal signals may be evaluated during simulation testing of the circuit design. However, in the context of a completed, packaged, manufactured integrated circuit, there are no practical techniques presently employed to monitor the state of internal signals not exposed to an external processor. Once the integrated circuit is fabricated as a die with an appropriate package, diagnosing failures involving such internal signal information is difficult if not impossible.

It is evident from the above discussion that a need exists for an improved circuit design that permits dynamic, flexible test and diagnosis of a completed application specific integrated circuit (e.g., in its packaged form) that provides access to internal signals of the application specific integrated circuit not otherwise accessible through the standard, specified program interface of an attached processor.

SUMMARY OF THE INVENTION

The present invention solves the above and other problems, thereby advancing the state of the useful arts, by providing circuits and methods for monitoring internal signals of an applications circuit's functional logic. Signals not exposed to an external interface may be monitored by a configurable/customizable test interrupt generator circuit integrated with the application functional logic. Features and aspects hereof add configurable test interrupt circuits to an application circuit design to permit dynamic, configurable interrupt generation from an integrated circuit based on conditions determined from monitoring of internal signals of the application circuit. The internal signals that may be tested and used to generate test interrupts are those not exposed to the external processor interface of the integrated circuit and thus may be configured to interrupt based on any internal state of the application specific functional circuits of the integrated circuit.

In one aspect, an integrated circuit is provided adapted for coupling to a processor. The integrated circuit comprises application functional logic adapted for performing the intended application function of the integrated circuit and adapted to generate an interrupt signal applied to the processor indicative of an event related to the intended application function. The circuit also comprises configurable test interrupt logic coupled to the application functional logic and configurable to generate the interrupt signal based on internal signals of the application functional logic unrelated to the intended application function.

In another aspect, an integrated circuit adapted for coupling to a processor is provided. The integrated circuit comprises application functional logic adapted for performing the intended application function of the integrated circuit and adapted to generate an interrupt signal applied to the processor indicative of an event related to the intended application function. The circuit also includes a test multiplexor adapted to receive a plurality of internal signals of the application functional logic and adapted to selectively apply a selected internal signal to an output of the test multiplexor. In addition, the circuit includes a plurality of comparison logic elements, each comparison logic element coupled to receive the selected internal signal from the output of the test multiplexor, each comparison logic element coupled to receive a corresponding comparison value from an attached processor, each comparison logic element adapted to compare the selected internal signal to a corresponding comparison value, and each comparison logic element adapted to generate the interrupt signal based on the comparison of its corresponding comparison value with the current value of the selected internal signal.

DETAILED DESCRIPTION OF THE DRAWINGS

Figure 1:
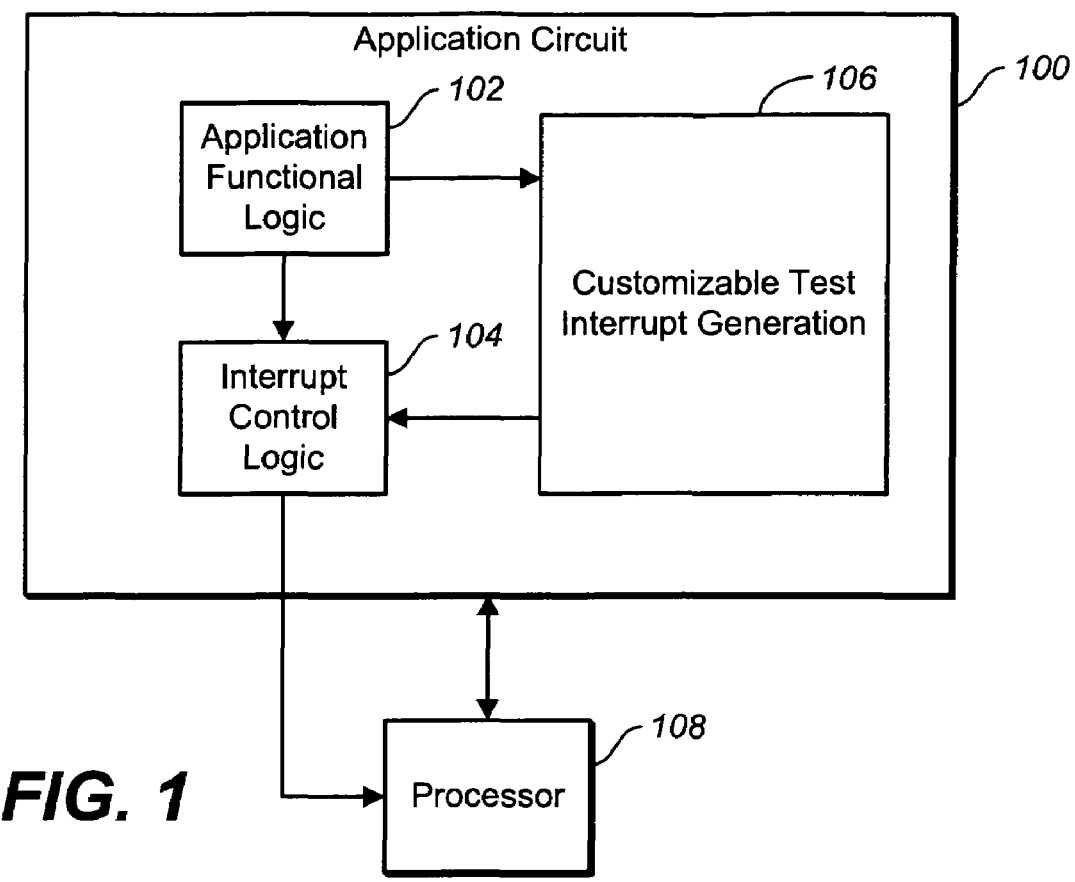
FIG. 1 is a block diagram of an exemplary application circuit adapted in accordance with features and aspects hereof to provide flexible, dynamic interrupt generation signals based on internal signals of the application circuit's functional logic.

FIG. 1 is a block diagram of an application circuit 100 adapted in accordance with features and aspects hereof to provide flexible, dynamic interrupt generation signals based on internal signals of the application circuit's functional logic. Application circuit 100 includes application functional logical 102 designed to perform the intended useful function of the application circuit 100 (e.g., its interface or assist processing features). Functional logic 102 therefore includes all electronics and logic required to perform the intended application for circuit 100 area this functional logic includes all intended, designed features to expose particular signals and conditions to an external processor 108. External processor 108 may interact with application functional logic 102 to configure operation of circuit 100 for its intended purpose and to monitor status of circuit 100 in normal operation.

In addition to such configuration and status information interaction exchanged between processor 108 and circuit 100 through functional logic 102, interrupt control logic 104 may apply an interrupt signal to processor 108 to interrupt normal processing thereof to request a response to an asynchronous event arisen in application functional logic 102.

In accordance with features and aspects hereof, circuit 100 also includes customizable/configurable test interrupt generation element 106 adapted to permit flexible, dynamic configuration of additional circuits for the generation of a test interrupt signal. The test interrupt signal may be indicative of occurrence of a dynamically defined state or condition within application functional logic 102 of circuit 100. Thus, test interrupt generation element 106 may be configured to monitor any internal signal paths of application functional logical 102 and may be configured to generate an interrupt signal for application to processor 108 (via interrupt control logic 104) to indicate occurrence of a dynamically programmed test condition during operation of application functional logic 102.

As noted above, the dynamic, flexible configuration for generation of the test interrupt signal by test interrupt generation element 106 enables improved debug and test for application circuit 100 in the design and manufacture environment. Where prior designs presented difficulties in evaluating the internal state of application functional logic 102 for purposes of debug and diagnosis of problems, the customizable/configurable test interrupt generation element 106 may be configured to monitor any internal signals of application functional logic 102 to detect particular anomalous events for purposes of debug and diagnosis of the operation of circuit 100. Therefore, test interrupt generation element 106 may be configured to monitor any condition or state within application functional logic 102 based on internal signals within the functional logic 102.

Those of ordinary skill in the art will recognize a variety of application circuits that may benefit from features and aspects hereof to integrate a customizable test interrupt generation element within the application circuit. Application circuit 100 therefore represents any such application circuit that may benefit from such an test interrupt generation based upon otherwise unexposed, inaccessible, internal signals of application functional logic 102. Those of ordinary skill in the art will further recognize that the processor 108 and application circuit 100 may be coupled by use of any of several well known, commercially available bus structures and/or high speed serial interface communication media. Still further, those of ordinary skill in the art will readily recognize numerous additional detailed elements useful within a fully functional application circuit 100. For simplicity and brevity of this description, such well known elements have been omitted.

Figure 2:
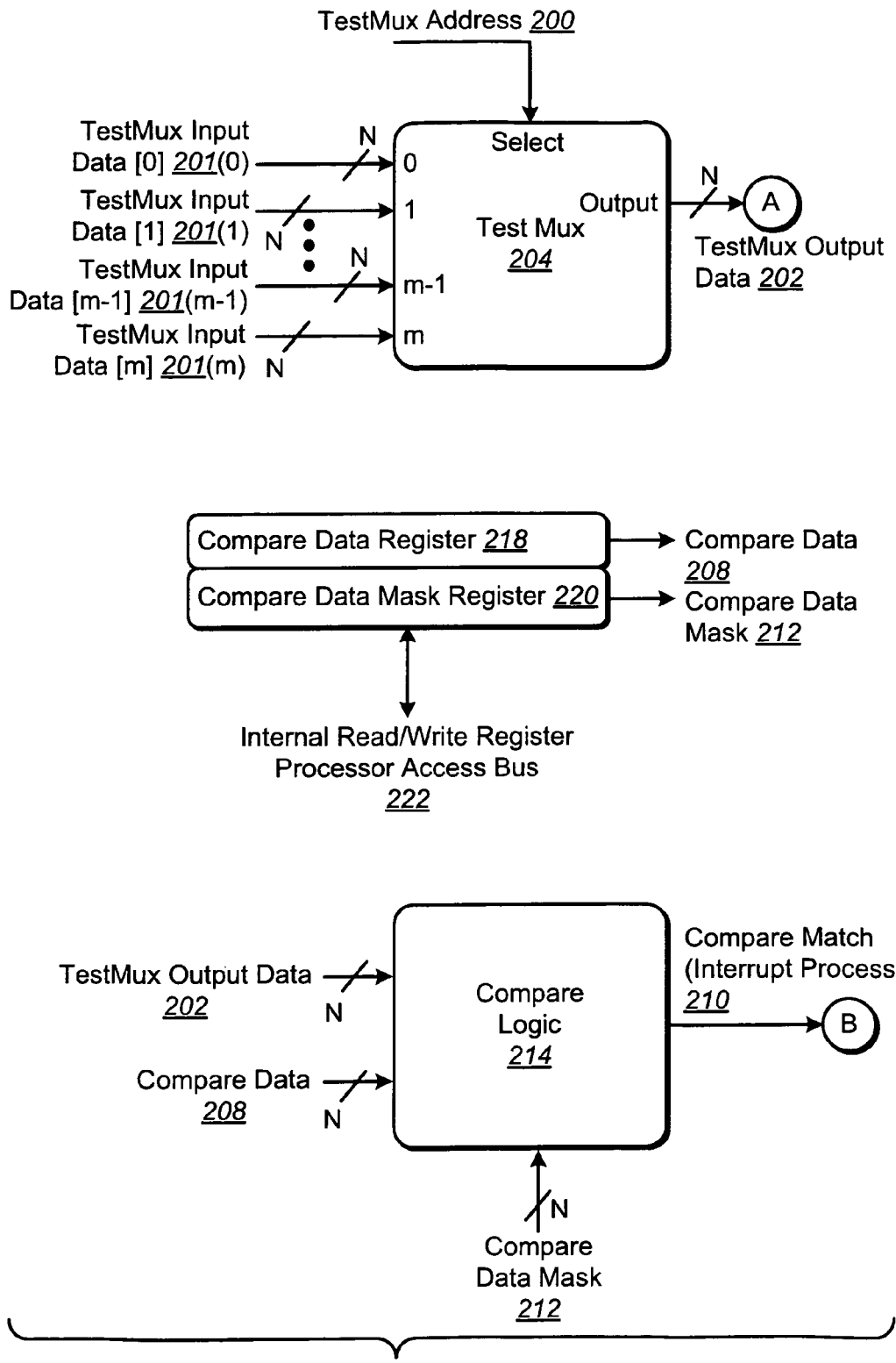
FIG. 2 is a block diagram providing additional exemplary details of an embodiment of a customizable test interrupt generation of FIG. 1.

FIG. 2 is a block diagram providing additional exemplary details of an embodiment of customizable test interrupt generation 106 of FIG. 1. Test mux 204 is a signal multiplexer circuit adapted to receive any number of input data signals and to selectively apply one of the input signals to its test mux's output data path 202. Test mux address signal 200 may be applied to a selection input of test mux 204 to identify which of the multiple input signals are to be applied to the output data path 202. Input data 201(0) through 201(m) represent any signals internal to the application functional circuits and logic. As noted above, any internal signal path within the application circuit's functional logic may be coupled to the various input signal paths 201(0 . . . m) of test mux 204. An external processor may, for example, program/configure a value in a test mux address register (not shown) for application via path 200 to the selection input of test mux 204. Thus, an external processor may configure test mux 204 to extend any of several internal signal paths (201(0 . . . m)) of the application circuit onto test mux output data path 202.

The configurable test interrupt generation circuits of FIG. 2 may also include compare logic 214. Compare logic 214 receives the output signal value from test mux output data path 202. A comparison data value is applied via path 208 to compare logic 214. In operation, compare logic 214 generates a test interrupt signal applied to the compare match output signal path 210 when the compare comparison data value on path 208 matches the test mux output data value on path 202. In addition, a comparison data mask value may be applied as an input on path 212 to identify which of multiple fields or bits within the comparison data value and test mux output data value are to be compared. The comparison data value applied to path 208 and the comparison data mask value applied to path 212 may be generated by the external processor and stored in registers 218 and 220, respectively. These registers may be accessed through an internal read/writer register processor access bus 222 along with other signals relating to other aspects of the application circuit.

Thus configurable test interrupt generation circuits are adapted to select an identified internal signal of the application circuit and compare that applied input value to a comparison data value provided by the external processor under control of a supplied mask value. Those of ordinary skill in the art will readily recognize that all input data paths 201 (0 . . . m) applied to test mux 204, the test mux output data path 202, the comparison data signal on path 208, and the mask value applied to path 212 may all be multiple bit wide fields—e.g., bus signals exchanged between the internal signal paths of the application functional logic and the comparison logic 214 through test mux 204. Thus each input data path 201 (0 . . . m) may represent a bus of related signals of any desired width for the particular application circuit. In like manner, registers 216, 218, and 220 may be a similar size/width capable of storing such a multi-bit bus value.

Those of ordinary skill in the art will readily recognize that additional well known detailed features useful for the full implementation of the configurable test interrupt generator of FIG. 2 have been omitted for simplicity and brevity of this description. Such well known features are readily apparent to those of ordinary skill in the art.

Figure 3:
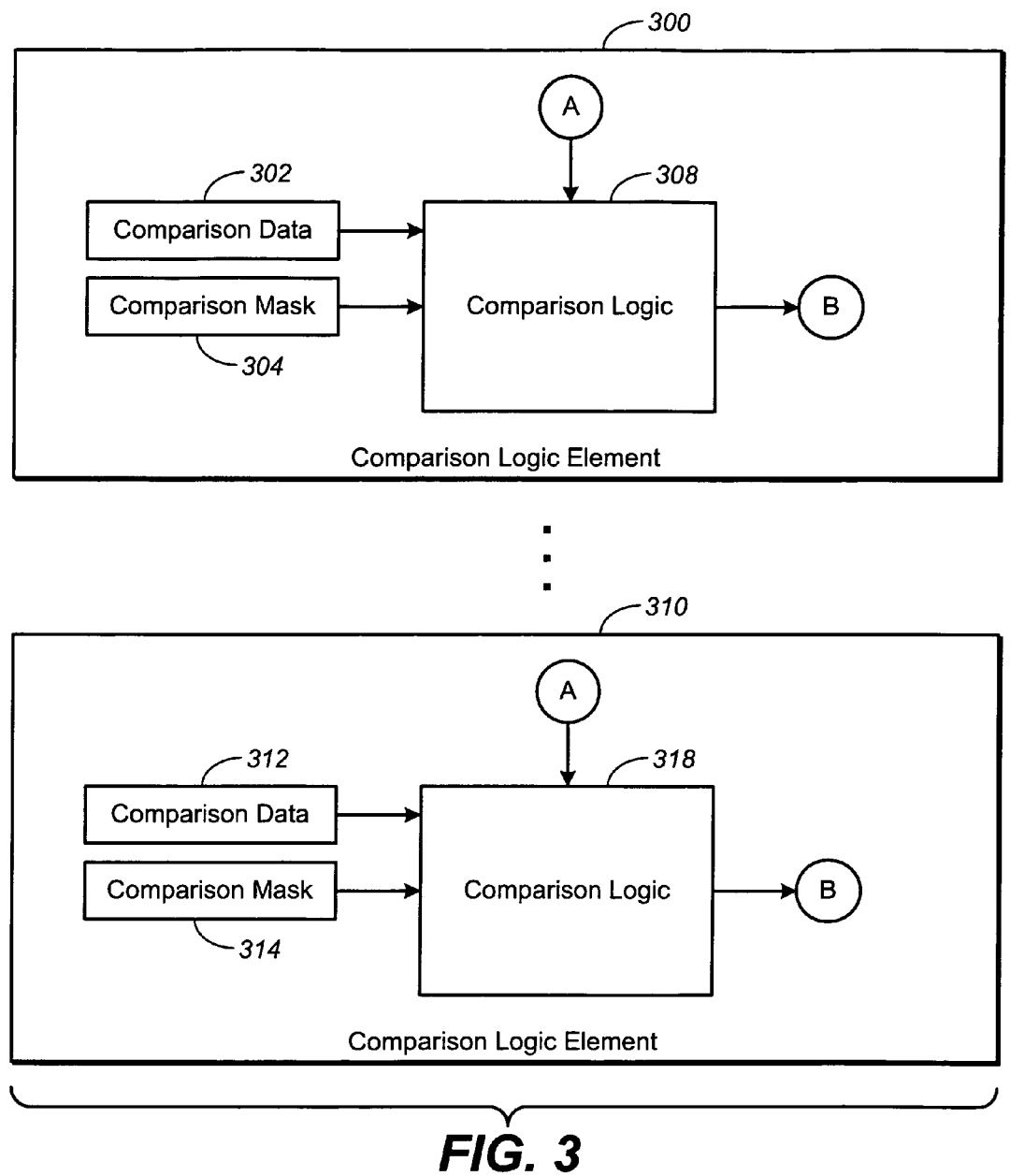
FIG. 3 is a block diagram of exemplary additional details of the circuits of FIG. 2 providing multiple comparison logic elements in accordance with features and aspects hereof.

FIG. 3 is a block diagram extending the features shown in FIG. 2 by providing multiple comparison logic elements of 300 and 310 all coupled in parallel to the test mux 204 of FIG. 2. Comparison logic element 300 includes a comparison logic component 308 similar to element 214 of FIG. 2. Comparison logic 308 receives the selected test mux output data (label "A" as above in FIG. 2). The comparison match test interrupt output signal generated by logic 308 is applied to path label B—the compare match output signal path of FIG. 2 above. Comparison logic element 300 also includes its own unique set of registers 302 and 304 for storing comparison data and comparison mask values, respectively, unique to this comparison logic element 300.

Comparison logic element 310 is essentially identical to the structure of comparison logic element 300 and is coupled to the test mux through the same signal path label A to receive the selected text mux output signal. Comparison logic 318 of element 310 operates identically to logic 308 of element 300 and generates its test interrupt signal on the same output signal path (label B). Comparison logic element 310 also includes its own unique set of registers 312 and 314 storing a unique comparison data value and comparison mask value, respectively.

An external processor (not shown) may therefore program particular comparison data and mask values in each of comparison logic elements 300 and 310. The unique values programmed in each element 300 and 310 may then be used to evaluate the current test mux selected output signals to generate its own test interrupt signal. Thus, any of multiple conditions may be simultaneously monitored each by a unique comparison logic element 300 or 310. Any number of such a comparison logic elements may be added to an application circuit design to permit monitoring of multiple conditions for generating a test interrupt based on the state of the internal signals within the application circuit functional logic. Each of the comparison logic elements of 300 and 310 may be coupled to a common test mux output (e.g., test mux 204 of FIG. 2).

Those of ordinary skill in the art will readily recognize a still further embodiment in which multiple test mux circuits (e.g., test mux 204 of FIG. 2) may be coupled to multiple comparison logic elements (e.g., elements 300 and 310 of FIG. 3) to allow still further flexibility in configuring and sensing a variety of states of internal signals within the functional logic of the application circuit to be debugged or tested. Further, those of ordinary skill in the art will readily recognize a variety of additional circuits and features within a fully operational comparison logic element as in FIG. 3. Such additional features are readily apparent to those of ordinary skill and the art and have been omitted for simplicity and brevity of this description.

Figure 4:
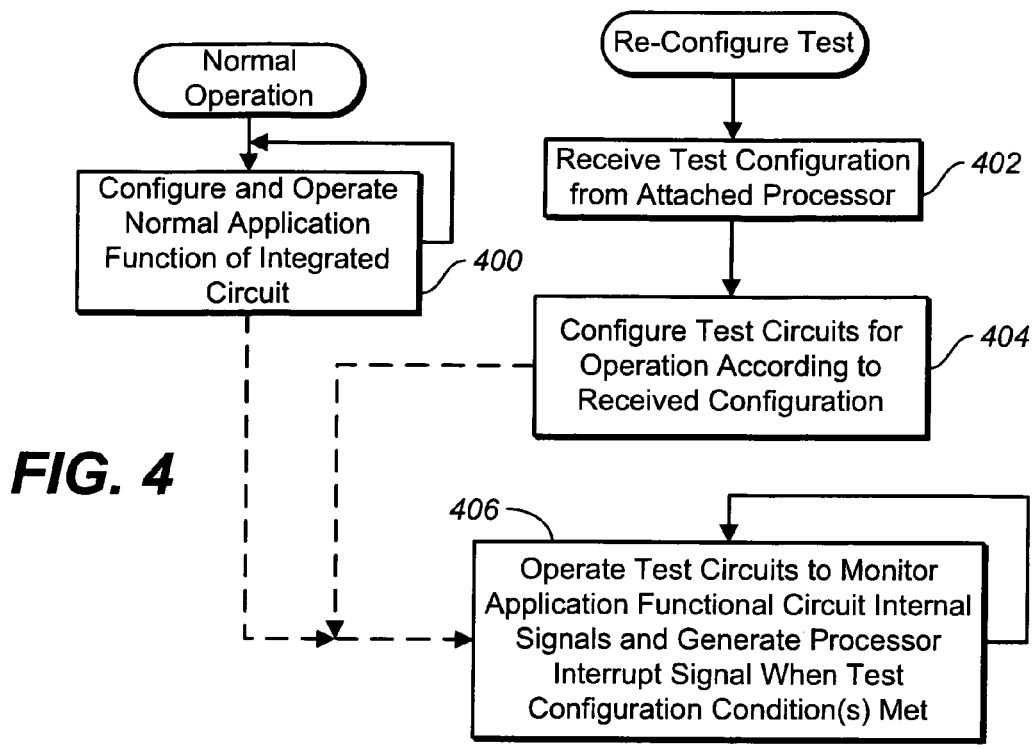
FIG. 4 is a flowchart describing the an exemplary method operable within an application circuit enhanced in accordance with features and aspects hereof to monitor or test internal signals of the application functional logic and to generate test interrupts in response to sensing identified states.

FIG. 4 is a flowchart describing the a method operable within an application circuit enhanced in accordance with features and aspects hereof to monitor or test internal signals of the application functional logic and to generate test interrupts in response to sensing identified states. Element 400 represents continued normal operation of the application function of the integrated circuit to be debugged or tested. The application circuit's functional logic will perform its intended purpose responding to stimuli as applied and interacting with an external processor for purposes of configuring and monitoring ongoing "normal" operation of the applications functional logic. The normal processing continues iteratively interacting with the external processor as required including generating interrupts for standard conditions specified and designed within the application functional logic. For example, the external processor may interact with the application functional logic of the integrated circuit by configuring standard features within specified registers or ports and by monitoring expected performance of the application functional logic reading status information from externally exposed registers and signals.

As noted above, numerous internal signals of the application circuit functional logic are not exposed to an external processor thereby complicating design time debugging and manufacture time testing of the application logic of the integrated circuit. Rather, in accordance with features and aspects hereof, a configurable test interrupt generator may be integrated with the application functional logic in the integrated circuit to permit flexible, dynamically configurable, testing and evaluation of internal signals of the application functional logic. Interrupts may be generated when the application functional logic internal signals indicate particular anomalous conditions as determined by the configurable test interrupt generation circuits.

Elements 402 through 406 therefore represent processing operable within the integrated circuit in parallel with ongoing normal operation of element 400. Element 400 is operable to receive test configuration information from an attached external processor. The received information may indicate, for example, a particular internal signal or collection of internal signals to be monitored (e.g., identified by a test mux address as described above with respect to FIG. 2). The configuration information received from an external processor may also include comparison data value and a comparison mask value to be utilized within comparison logic such as that described above with respect to FIGS. 2 and 3. The values so received by operation of element 402 may be stored in appropriate registers or other storage features of the integrated circuit for use by the configurable test interrupt generation logic features.

The information so received by element 402 is then utilized in element 404 to configure the test circuits for operation in accordance with the received configuration information. For example, the test interrupt generation circuits may be configured simply by storage of the received configuration information in appropriate registers associated with the test mux and with one or more comparison logic elements. Elements of 402 and 404 may be repetitively executed in response to receipt of new configuration information from the attached, external processor.

The current configuration information associated with the test interrupt generation features as well as the current values of selected internal signals from the application functional logic of the integrated circuit are both applied as inputs to processing of element 406 (as indicated by the dashed lines coupling element 400 and 404 to element 406). Element 406 is then continuously executed to operate the test interrupt generation circuits of the integrated circuit to monitor the selected internal signals of the application functional logic and to generate an interrupt signal when the monitored internal signal values match a configured comparison value. As noted above, with respect to FIGS. 2 and 3, the configuration information may include comparison data value information and comparison mask value information, all stored in respective registers or otherwise recorded within the integrated circuit. These various configuration values and current selected internal signal values are used by the processing of element 406 to determine when a test interrupt signal should be generated and applied to the external processor indicating sensing of a configured state of the selected internal signal(s).

Figure 5:
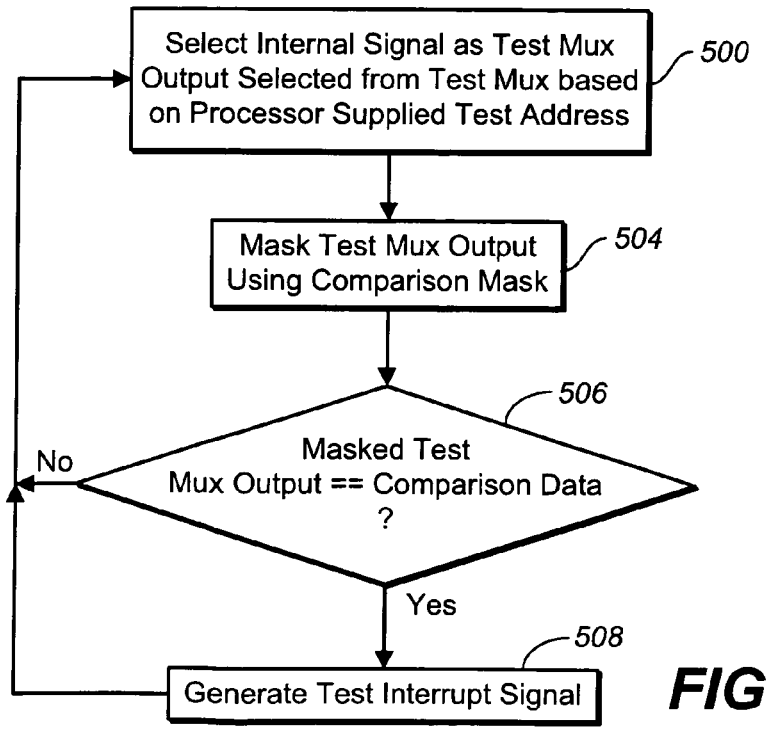
FIG. 5 is a flowchart providing exemplary additional details of the processing of FIG. 4

FIG. 5 is a flowchart providing additional exemplary details of the processing of element 406 of FIG. 4. Element 500 is first operable to select an internal signal from among the plurality of internal signals of the application functional logic as a selected test mux output value. The selection may be based upon the processor supplied test mux address value received as configuration information as discussed above in FIG. 4. Element 504 is next operable to utilize the supplied comparison mask to mask the test mux output value selected by operation of element 500. Element 506 then determines whether the masked test mux output equals the supplied comparison data value provided in the current configuration for this comparison logic element. If the masked test output value does not match the presently configured comparison data value, processing continues as above looping back to element 500 to await a change of state which may match the configured test values. If element 506 determines that the masked test mux output value matches the current comparison data value, element 508 is operable to generate a test interrupt signal for application to the external processor. Details of the generation of an interrupt signal as a level signal or a pulse and associated logic to clear the setting of such a signal are well known to those of ordinary skill in the art and omitted here for the sake of brevity of this description. Following generation of the test interrupt signal, processing continues, as above, looping back to element 500 to continue monitoring the operation of the application functional logic of the integrated circuit and to generate a next test interrupt signal when a configured condition arises.

Those of ordinary skill in the art will readily recognize numerous additional steps in a fully functional method to generate and reset test interrupt conditions. For example, a comparison logic element may be disabled when its corresponding conditions have been met and a test interrupt signal corresponding thereto has been generated. Or, for example, information relating to the detected condition may be stored in other registers accessible by the external processor for analysis of the anomalous condition detected in the operation of the application functional logic. Other well known features to enable or disable particular comparison logic elements as well as synchronizing, when necessary, the loading of configuration information and the application of current configuration information to monitoring of the ongoing normal operation of the application functional logic will be readily apparent to those of ordinary skill in the art. Such well known additional features are omitted here simply for brevity of this description.

Those of ordinary skill in the art will readily recognize that the processing of FIGS. 4 and 5 may be replicated for each of multiple comparison logic elements as shown in FIGS. 2 and 3. Each comparison logic element may execute substantially in parallel and as described, for example, in FIGS. 4 and 5.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. In particular, those of ordinary skill in the art will readily recognize that features and aspects hereof may be implemented equivalently in electronic circuits or as suitably programmed instructions of a general or special purpose processor. Such equivalency of circuit and programming designs is well known to those skilled in the art as a matter of design choice. As a result, the invention is not limited to the specific examples and illustrations discussed above, but only by the following claims and their equivalents.

What is claimed is:

1. An integrated circuit for coupling to a processor, the integrated circuit comprising:

application functional logic for performing the intended application function of the integrated circuit and for generating a first interrupt signal for applying to the processor indicative of an event related to the intended application function;

configurable test interrupt logic coupled to the application functional logic and configurable for generating a second interrupt signal based on internal signals of the application functional logic, wherein generating the second interrupt signal by the configurable test interrupt logic is unrelated to the intended application function; and interrupt control logic for applying at least one of the first interrupt signal and the second interrupt signal to the processor.

2. The circuit of claim 1
wherein the configurable test interrupt logic further comprises:

a test multiplexor for receiving a plurality of internal signals of the application functional logic and for selectively applying a selected internal signal to an output of the test multiplexor; and comparison logic for receiving the selected internal signal from the output of the test multiplexor, for comparing the selected internal signal to a comparison value, and for generating the second interrupt signal based on the comparison of the comparison value with the current value of the selected internal signal.

3. The circuit of claim 2
wherein the configurable test interrupt logic further comprises:

a compare value register for storing the comparison value received from the processor.

4. The circuit of claim 2
wherein the configurable test interrupt logic further comprises:

a compare mask register for storing a comparison mask value indicating which of multiple bits of the comparison value and of the selected internal signal are to be compared by the comparison logic.

5. The circuit of claim 2
wherein the configurable test interrupt logic further comprises:

a test address register for storing a test address value received from the processor wherein the test address value is applied to the test multiplexor as a selection input to control selection of the selected internal signal.

6. An integrated circuit for coupling to a processor, the integrated circuit comprising:

application functional logic for performing the intended application function of the integrated circuit and for generating a first interrupt signal for applying to the processor indicative of an event related to the intended application function;

a test multiplexor for receiving a plurality of internal signals of the application functional logic and for selectively applying a selected internal signal to an output of the test multiplexor; and a plurality of comparison logic elements, each comparison logic element coupled for receiving the selected internal signal from the output of the test multiplexor, for receiving a corresponding comparison value from the processor, for comparing the selected internal signal to a corresponding comparison value, and for generating a second interrupt signal based on the comparison of its corresponding comparison value with the current value of the selected internal signal.

7. The circuit of claim 6
wherein each comparison logic element further comprises:
a compare value register for storing its corresponding comparison value received from the attached processor; and
a compare mask register for storing a corresponding comparison mask value indicating which of multiple bits of its corresponding comparison value and of the selected internal signal are to be compared by the comparison logic element.

8. The circuit of claim 6, further comprising:
a test address register for storing a test address value received from the processor wherein the test address value is applied to the test multiplexor as a selection input to control selection of the selected internal signal.

9. A method operable within an integrated circuit, the method comprising:
operating application functional circuit of the integrated circuit to perform the intended application function wherein the application functional circuits include a plurality of internal signals that are not accessible to an external processor;
operating test interrupt circuit of the integrated circuit, responsive to signals from the external processor and substantially concurrently with operation of the application functional circuits, to controllably generate a test interrupt signal based on the state of the plurality of internal signals; and
applying the test interrupt signal to the external processor.

10. The method of claim 9
wherein the step of operating test interrupt circuit further comprises:
applying the plurality of internal signals as inputs to a test multiplexor, wherein the test multiplexor is part of the test interrupt circuit of the integrated circuit;
receiving a test address signal from the external processor identifying an internal signal to be tested of the plurality of internal signals;
applying the test address signal as a selection input to the test multiplexor to select the identified internal signal for use in generating the test interrupt signal.

11. The method of claim 10
wherein the step of operating test interrupt circuit further comprises:
applying the identified internal signal to a comparison circuit;
comparing the identified internal signal to a comparison value; and
generating the test interrupt signal when the identified internal signal value equals the comparison value.

12. The method of claim 11
wherein the step of comparing further comprises:
comparing only portions of the internal signal value indicated by a comparison mask with corresponding portions of the comparison value.

* * * * *